US006889756B1

(12) United States Patent
Hou

(10) Patent No.: US 6,889,756 B1
(45) Date of Patent: May 10, 2005

(54) HIGH EFFICIENCY ISOTHERMAL HEAT SINK

(75) Inventor: Tung-Fu Hou, Hsinchuang (TW)

(73) Assignee: EPOS Inc., Taipei (TW)

( * ) Notice: Subject to any disclaimer, the term of this patent is extended or adjusted under 35 U.S.C. 154(b) by 0 days.

(21) Appl. No.: 10/818,910

(22) Filed: Apr. 6, 2004

(51) Int. Cl.⁷ ............................................. F28D 15/00
(52) U.S. Cl. ........................... 165/104.33; 165/104.21; 165/185; 165/80.3; 361/700; 257/715; 174/15.2
(58) Field of Search ...................... 165/104.33, 104.26, 165/104.21, 185, 80.4, 80.3; 361/699, 700; 257/714–716; 174/15.2

(56) References Cited

U.S. PATENT DOCUMENTS

| | | | |
|---|---|---|---|
| 4,461,343 A * | 7/1984 | Token et al. ............ | 165/104.26 |
| 5,427,174 A * | 6/1995 | Lomolino et al. ...... | 165/104.13 |
| 6,167,948 B1 * | 1/2001 | Thomas .................. | 165/104.26 |
| 6,269,866 B1 * | 8/2001 | Yamamoto et al. .... | 165/104.26 |
| 6,529,377 B1 * | 3/2003 | Nelson et al. .............. | 361/699 |
| 6,564,860 B1 * | 5/2003 | Kroliczek et al. ...... | 165/104.26 |
| 6,601,643 B2 * | 8/2003 | Cho et al. ............... | 165/104.26 |
| 6,651,735 B2 * | 11/2003 | Cho et al. ............... | 165/104.26 |
| 6,698,503 B2 * | 3/2004 | Son et al. ............... | 165/104.26 |
| 2004/0069460 A1 * | 4/2004 | Sasaki et al. ........... | 165/104.26 |

* cited by examiner

Primary Examiner—Terrell McKinnon
(74) Attorney, Agent, or Firm—William E. Pelton, Esq.

(57) ABSTRACT

An isothermal heat sink use operational principles of heat pipes and includes a plate-like body including a housing, an interior partition and a wick. The housing has an inner chamber under a vacuum. The interior partition divides the inner chamber into an upper and lower half chamber and has a central through hole and multiple air passages. The wick containing a working fluid is held in the central through hole and has a lower evaporating section and an upper condensing section that are held respectively in the lower and the upper half chambers. Therefore, the working fluid in the evaporating section evaporates and produces a vapor that enters the upper half chamber from the lower half chamber through the air passages. The vapor condenses into liquid that enters the condensing section and returns to the evaporating section to improve cooling efficiency of the heat sink.

11 Claims, 4 Drawing Sheets

HIGH EFFICIENCY ISOTHERMAL HEAT SINK

BACKGROUND OF THE INVENTION

1. Field of the Invention

The present invention relates to a heat sink for electronic instruments, and more particularly to a high efficiency isothermal heat sink.

2. Description of Related Art

Integrated circuits (IC) are extensively used for various kinds of electronic instruments. Although power to drive the ICs comprising chips is very small, heat is generated when the integrated circuits operate. In high performance integrated circuits, such as central processing units (CPU) or video integrated circuits for computers, heat rapidly increases when the ICs operate. The increasing heat must be removed quickly from the ICs to keep the ICs from being damaged.

Heat sinks are used extensively to dissipate unwanted heat from operating ICs. Many techniques exist to make heat sinks quickly transfer heat from operating integrated circuits. Heat pipes have been used to cool integrated circuits for electronic instruments for decades.

With reference to FIG. 4, a conventional heat sink that uses the principles of the heat pipe in accordance with the prior air comprises a hollow plate-like body (60), a wick (61) and external fins (70). The body (60) has a top (not numbered), a bottom (not numbered) and an inner chamber (601). The inner chamber (601) is under a vacuum and has an interior surface (not numbered). The wick (61) is a capillary structure and is mounted on the interior surface of the body (60) to create a capillary action. The wick (61) may be a porous structure made of materials like steel, aluminum, nickel or copper in various ranges of pore sizes or a mesh structure. The wick (61) is fabricated using metal foams or powder metallurgy. Fibrous materials, like ceramics have also been used widely, today.

The wick (61) has a condensing section (not numbered) and an evaporating section (not numbered) and contains a working fluid (not shown), generally pure water. When the heat sink is attached to a heat source (80) to dissipate heat from the heat source (80), the evaporating section is positioned adjacent to the heat source (80), and the condensing section is opposite to the evaporating section. The wick (61) transports the working fluid from the condensing section to the evaporating section by capillary action. The wick (61) must also be able to distribute the working liquid around the evaporating section to any area where heat is likely to be received by the heat sink.

As the heat source (80) heats the evaporating section of the wick (61), the working fluid in the evaporating section of the wick (61) evaporates and forms a hot vapor. Heat being absorbed through the bottom of the body (60) and dissipated through the top of the body causes the hot vapor (straight arrows) to flow toward the top of the body (60). Heat dissipated from the vapor is conducted to the fins (70) through the top of the body (60) and dissipated to the environment. The vapor cools and condenses to liquid that is absorbed by the wick (61) and is returned to the evaporating section by the capillary action of the wick (61) so that the working fluid is recycled. The working fluid in the evaporating section of the wick (61) is evaporated again, and the whole cycle is repeated to transfer heat from the heat source (80) for cooling.

The fins (70) are mounted on the top of the body (60) adjacent to the condensing section of the wick (61) to dissipate heat from the condensing section of the wick (61).

However, the vapor and the returning working fluid in the wick (61) are in the same inner chamber (601), which causes a low efficiency of heat exchange in the inner chamber (601) for the conventional heat sink. Additionally, because the inner chamber (601) is kept at a vacuum, and the heat sink does not have any support between the top and the bottom of the body (60), the top and the bottom are easily drawn inward by the vacuum in the inner chamber (601). The deformed top and bottom of the body (60) cannot efficiently contact with the heat source (80) and the fins (70), which further lowers the efficiency of the heat sink.

To overcome the shortcomings, the present invention provides a high efficiency heat sink to mitigate or obviate the aforementioned problems.

SUMMARY OF THE INVENTION

The main objective of the invention is to provide a high efficiency heat sink to quickly dissipate heat from a heat source.

A high efficiency isothermal heat sink in accordance with the present invention includes a plate body. The body has a top and includes a housing, an interior partition and a wick. The housing has an inner chamber under a vacuum and includes a cover and a base. The interior partition is mounted between the cover and the base to divide the inner chamber into an upper half chamber and a lower half chamber and has a central through hole and multiple air passages to allow the lower half chamber and the upper half chamber to communicate. The wick contains a working fluid, is mounted and held in the central through hole in the interior partition and has a lower evaporating section and an upper condensing section. The lower evaporating and the upper condensing sections are respectively held in the lower and the upper half chambers. Therefore, the working fluid in the lower evaporating section is evaporated to produce a vapor that flows into the upper half chamber through the air passages in the interior partition from the lower half chamber. In the upper half chamber, the vapor condenses into liquid in the condensing section where the working fluid in the condensing section returns to the evaporating section to provide an improved efficiency of cooling electronic instruments.

Other objectives, advantages and novel features of the invention will become more apparent from the following detailed description when taken in conjunction with the accompanying drawings.

DETAILED DESCRIPTION OF PREFERRED EMBODIMENT

Figure 1:
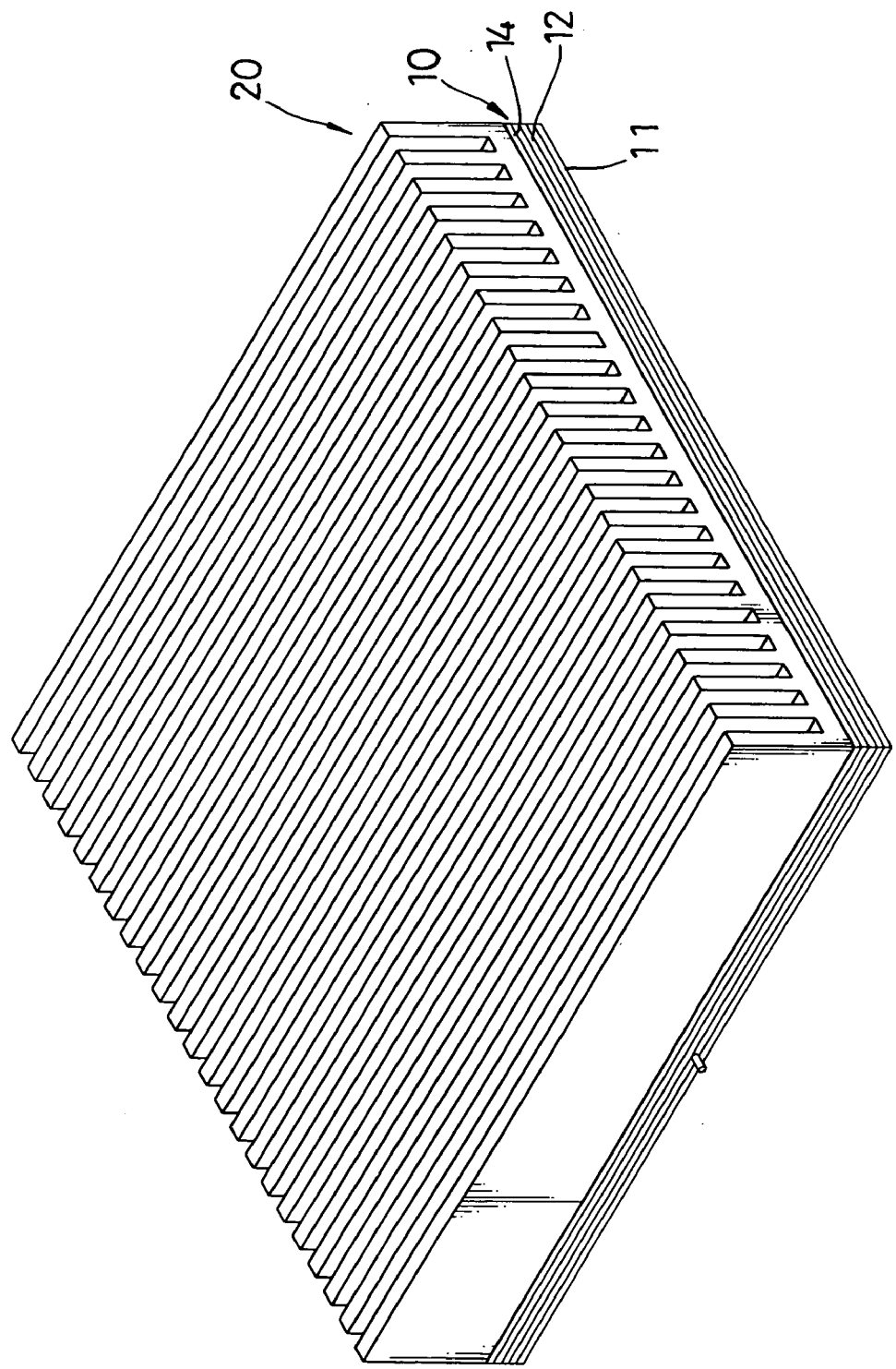
FIG. 1 is an enlarged perspective view of a high efficiency isothermal heat sink in accordance with the present invention.
Figure 2:
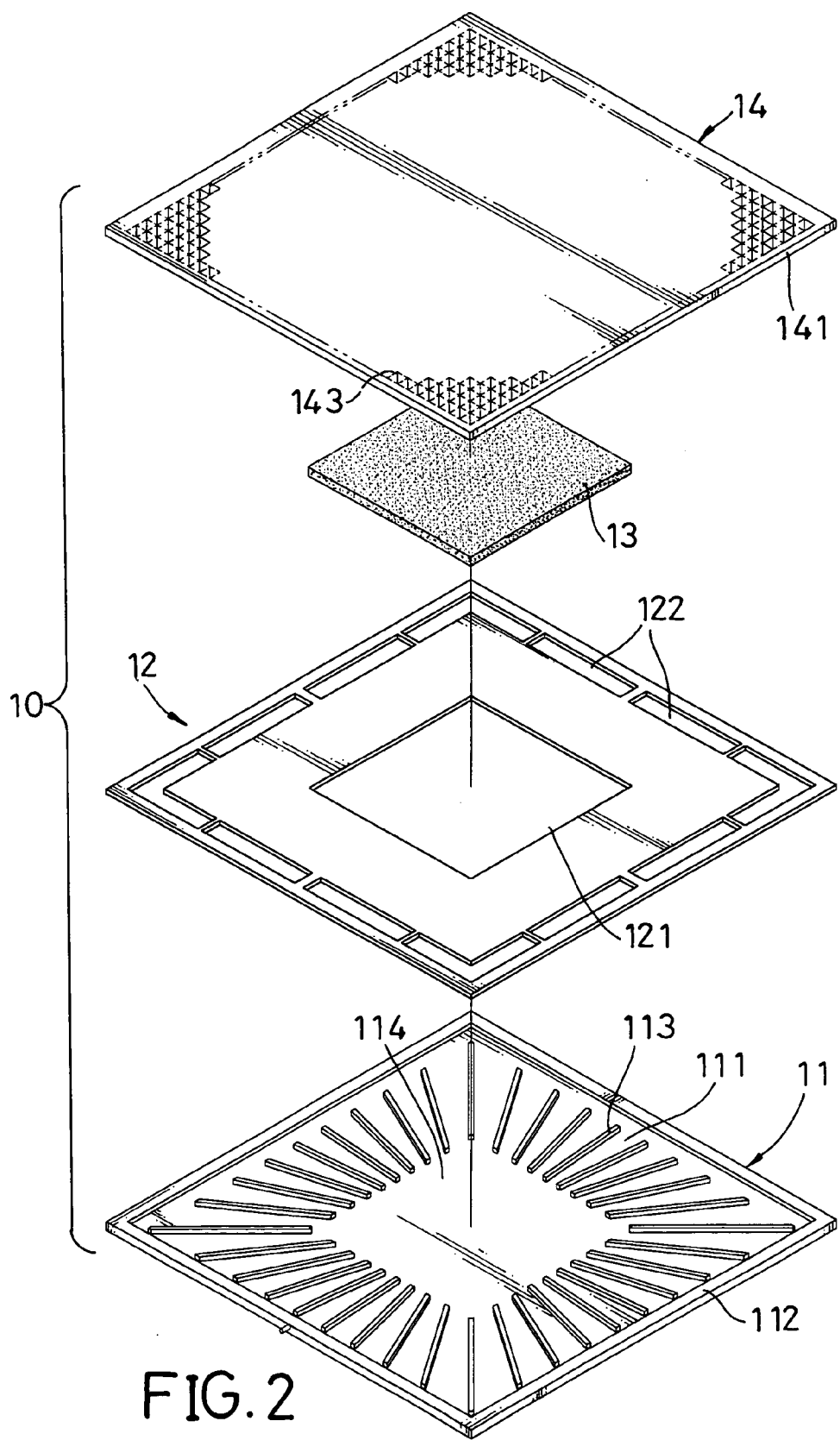
FIG. 2 is an exploded perspective view of a plate-like body of the isothermal heat sink in FIG. 1.

With reference to FIGS. 1 and 2, a high efficiency isothermal heat sink in accordance with the present invention uses the operational principles of heat pipes and comprises a plate-like body (10) and external fins (20).

Figure 3:
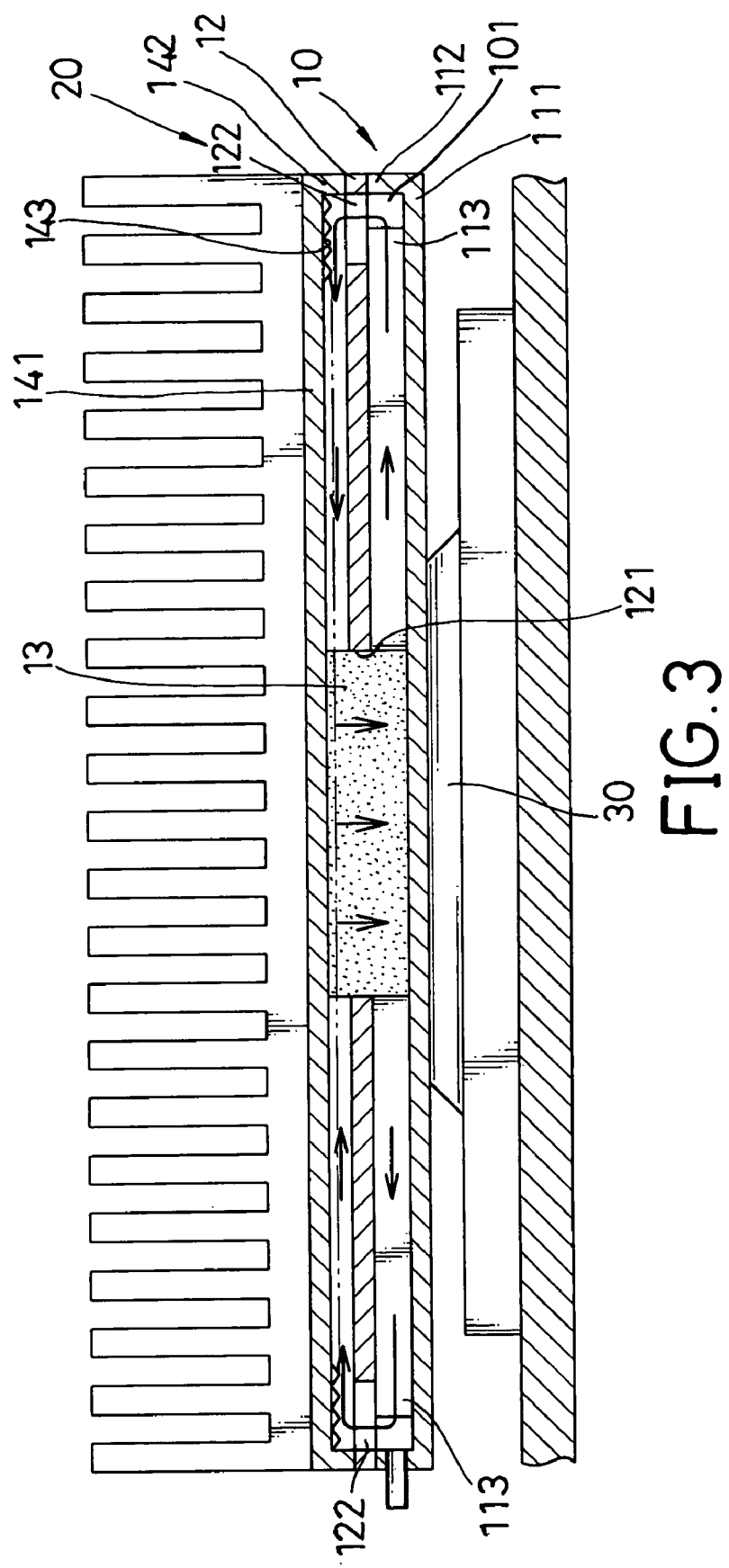
FIG. 3 is an enlarged, operational side plan view in partial section of the heat sink in FIG. 1.
Figure 4:
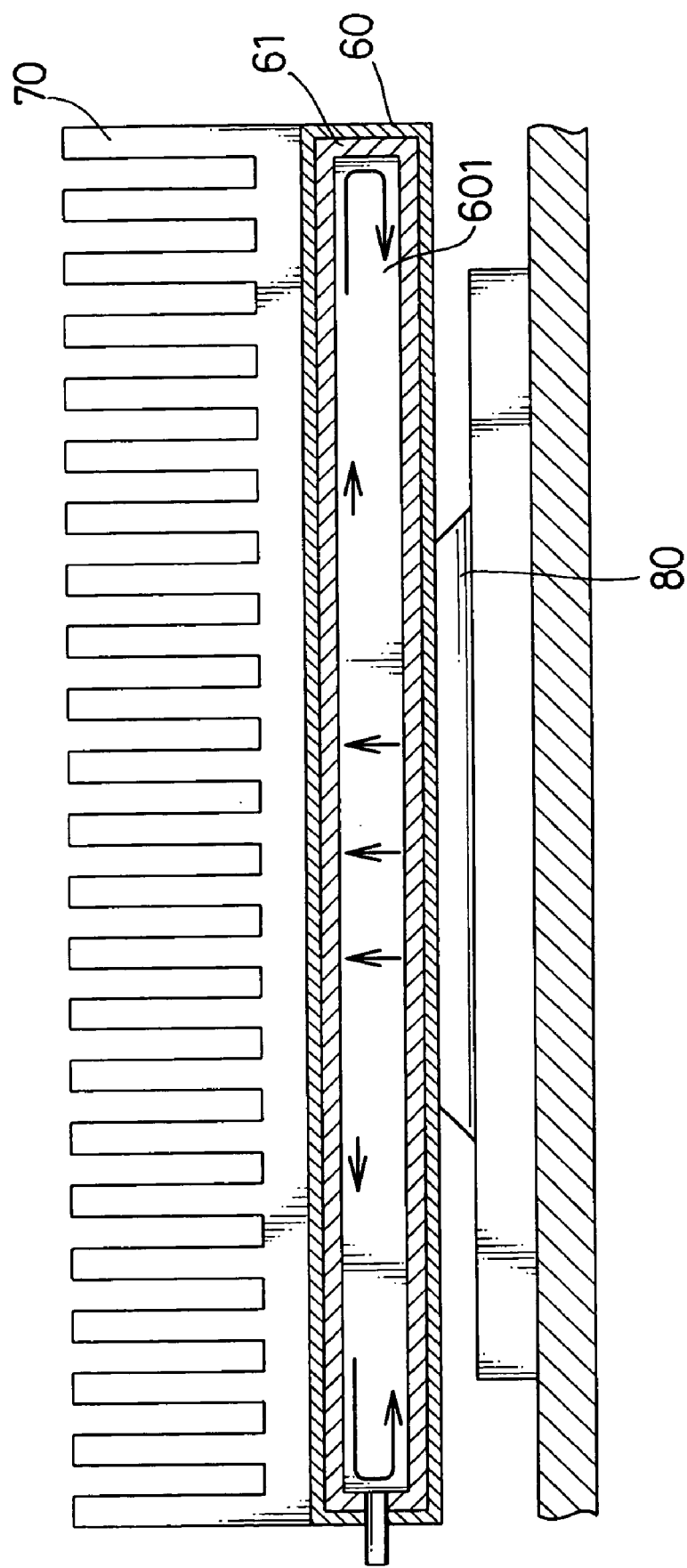
FIG. 4 is an enlarged, operational side plan view in partial section of a conventional isothermal heat sink in accordance with the prior art.

With further reference to FIG. 3, the body (10) is hollow, has a top (not numbered), a bottom (not numbered) and comprises a housing (not numbered), a wick (13) and an interior partition (12). The housing has an inner chamber (101), may be made of metal and comprises a cover (14) and a base (11). The inner chamber (101) is maintained in a vacuum. The cover (14) comprises an upper substrate (141) and an upper flange (142). The upper substrate (141) and has a bottom (not numbered), an outer edge (not numbered) and multiple grooves (143). The grooves (143) are defined in the bottom. The upper flange (142) is integrally formed on the bottom along the outer edge of the upper substrate (141) and has a thickness.

The base (11) is attached to the upper flange (142) of the cover (14) and comprises a lower substrate (111), a lower flange (112) and multiple radial ribs (113). The lower substrate (111) may be rectangular and has a top (not numbered) and an outer edge (not numbered). The lower flange (112) is integrally formed on the top along the outer edge of the lower substrate (111), is aligned with the upper flange (142) of the cover (14) and has a thickness greater than the thickness of the upper flange (143). The radial ribs (113) protrude from the top of the lower substrate (111) and form a central mounting area (114). The central mounting area (114) may be rectangular.

The interior partition (12) may be made of metal, is mounted between the cover (14) and the base (11) and is fastened between the upper flange (142) and the lower flange (112) by soldering or welding and divides the inner chamber (101) into an upper half chamber (not numbered) and a lower half chamber (not numbered). The interior partition (12) has a top (not numbered), a bottom (not numbered), an outer edge (not numbered), a central through hole (121) and multiple air passages (122). The central through hole (121) is defined through the interior partition (12) and is aligned with the central mounting area (114) on the top of the lower substrate (111) of the base (11). The air passages (122) are defined completely through the interior partition (12) along the outer edge so the upper half chamber can communicate with the lower half chamber.

The wick (13) may have a conventional structure, such as a porous structure or a mesh structure and may be made of material like steel, aluminum, nickel or copper with various pore sizes, contains a working fluid and has an upper condensing section (not numbered) and a lower evaporating section (not numbered). The lower evaporating section is mounted on the central mounting area (114) on the lower substrate (111) in the lower half chamber of the housing. The upper condensing section is fitted into and extends out of the central through hole (121) in the interior partition (12), is held in the upper half chamber and abuts the bottom of the upper substrate (141).

The external fins (20) may have a conventional structure and are mounted on the top of the body (10) adjacent to the upper condensing section of the wick (13).

With reference to FIGS. 2 and 3, the heat sink is attached to a heat source (30) to dissipate heat from the heat source (30). The lower evaporating section of the wick (13) is placed above the heat source (30) that raises the temperature in the lower evaporating section. The working fluid in the lower evaporating section is heated and produces a hot vapor. The vapor in the lower half chamber flows, is directed by the radial ribs (113) in the lower half chamber toward the air passages (122) and enters into the upper half chamber through the air passages (122). The vapor in the upper half chamber is cooled and eventually condenses to a liquid on the bottom of the upper substrate (141). The condensed liquid is directed by the grooves (143) toward the upper condensing section of the wick (13) where the working fluid moves downward to the lower evaporating section by gravity and capillary action of the wick (13) to recycle the working fluid. The returning working fluid in the lower evaporating section evaporates again, and the whole cycle is repeated to cool the heat source (30). The heat in the upper condensing section is conducted to the external fins (20) that radiate the received heat to the surrounding air.

Consequently, the vapor and the working fluid move along different paths to keep from interfering with each other. The grooves (143) on the bottom of the upper substrate (111) increase surface area that the vapor contacts so more heat can be transferred to the upper substrate (111) and ultimately to the external fins (20). The efficiency of the heat sink is improved so that the heat sink will quickly dissipate heat from electronic instruments.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the scope of the appended claims.

What is claimed is:

1. A high efficiency isothermal heat sink comprising:
   a plate body with a top and comprising
      a housing having an inner chamber under a vacuum and comprising
         a cover comprising an upper substrate having a bottom and an outer edge and an upper flange integrally formed on the bottom along the outer edge of the upper substrate; and
         a base attached to the upper flange of the cover and comprising a lower substrate having a top and an outer edge and a lower flange integrally formed on the top along the outer edge of the lower substrate and aligned with the upper flange of the cover;
      an interior partition mounted between the cover and the base and fastened between the upper flange and the lower flange to divide the inner chamber into an upper half chamber and a lower half chamber and having a central through hole and multiple air passages to allow the lower half chamber to communicate with the upper half chamber; and
      a wick containing a working fluid mounted on the top of the lower substrate, held in the central through hole in the interior partition and having a lower evaporating section on top of the lower substrate and an upper condensing section extending out of the central through hole in the interior partition, held in the upper half chamber and abutting the bottom of the upper substrate;
   wherein the working fluid in the lower evaporating section evaporates to produce a vapor in the lower half chamber, which flows into the upper half chamber through the air passages in the interior partition, the vapor condenses into a liquid that is directed into the upper condensing section where the working fluid in the upper condensing section returns to the lower evaporating section.

2. The high efficiency isothermal heat sink as claimed in claim 1, wherein the upper substrate further has multiple grooves defined in the bottom of the upper substrate.

3. The high efficiency isothermal heat sink as claimed in claim 1, wherein the base further comprises multiple radial ribs protruding from the top of the lower substrate to form a central mounting area aligned with the central through hole in the interior partition to mount the lower evaporating section of the wick.

4. The high efficiency isothermal heat sink as claimed in claim 1, wherein the interior partition further has a top, an outer edge, and the air passages are defined completely through the interior partition along the outer edge.

5. The high efficiency isothermal heat sink as claimed in claim 1, wherein the upper flange of the cover further has a thickness, and the lower flange of the base further has a thickness greater than the thickness of the upper flange.

6. The high efficiency isothermal heat sink as claimed in claim 1 further comprises external fins mounted on the top of the body.

7. The high efficiency isothermal heat sink as claimed in claim 1, wherein the cover, the base and the interior partition are made of metal.

8. The high efficiency isothermal heat sink as claimed in claim 2, wherein the base further comprises multiple radial ribs protruding from the top of the lower substrate to form a central mounting area aligned with the central through hole of the interior partition to mount the lower evaporating section of the wick.

9. The high efficiency isothermal heat sink as claimed in claim 8, wherein the interior partition further has a top, an outer edge, and the air passages are defined completely through the interior partition along the outer edge.

10. The high efficiency isothermal heat sink as claimed in claim 9, wherein the upper flange of the cover further has a thickness, and the lower to flange of the base further has a thickness greater than the thickness of the upper flange.

11. The high efficiency isothermal heat sink as claimed in claim 10 further comprises external fins mounted on the top of the body.

* * * * *